(12) United States Patent
Bruls et al.

(10) Patent No.: US 7,843,552 B2
(45) Date of Patent: Nov. 30, 2010

(54) LITHOGRAPHIC APPARATUS, DEVICE MANUFACTURING METHOD, AND MASK HAVING A PELLICLE ATTACHED HERETO

(75) Inventors: Richard Joseph Bruls, Eindhoven (NL); Orlando Serapio Cicilia, Eindhoven (NL); Tammo Uitterdijk, De Bilt (NL); Herman Boom, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1183 days.

(21) Appl. No.: 11/154,951

(22) Filed: Jun. 17, 2005

(65) Prior Publication Data

US 2005/0280789 A1    Dec. 22, 2005

Related U.S. Application Data

(60) Provisional application No. 60/580,251, filed on Jun. 17, 2004.

(51) Int. Cl.
*G03B 27/62* (2006.01)
*G03B 27/58* (2006.01)

(52) U.S. Cl. .......................................... 355/75; 355/72
(58) Field of Classification Search .................. 355/53, 355/72–76; 430/5, 20, 30
See application file for complete search history.

(56) References Cited

U.S. PATENT DOCUMENTS

| | | | | |
|---|---|---|---|---|
| 6,406,573 B1* | 6/2002 | Cerio | ........................... | 156/64 |
| 6,731,378 B2* | 5/2004 | Hibbs | ........................... | 355/75 |
| 6,795,170 B2* | 9/2004 | Mishiro et al. | ................. | 355/75 |
| 6,911,283 B1* | 6/2005 | Gordon et al. | ................. | 430/5 |
| 2003/0035222 A1* | 2/2003 | Okada et al. | ................. | 359/629 |
| 2005/0048376 A1* | 3/2005 | Eschbach et al. | ............... | 430/5 |

\* cited by examiner

*Primary Examiner*—Hung Henry Nguyen
(74) *Attorney, Agent, or Firm*—Pillsbury Winthrop Shaw Pittman LLP

(57) ABSTRACT

The mechanical properties of a pellicle frame and/or the pellicle are optimized so that the mechanical effect of the frame and pellicle on the mask shape in use is optimum for imaging. In particular the pellicle frame assembly may be arranged to be mechanically neutral, i.e., the mask adopts the same shape with pellicle attached as it would without the pellicle.

16 Claims, 2 Drawing Sheets

LITHOGRAPHIC APPARATUS, DEVICE MANUFACTURING METHOD, AND MASK HAVING A PELLICLE ATTACHED HERETO

This application claims priority to U.S. Provisional Patent Application No. 60/580,251, filed Jun. 17, 2004, herein incorporated by reference in its entirety.

BACKGROUND OF THE INVENTION

1. Field of the Invention

The present invention relates generally to a lithographic apparatus and a device manufacturing method.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In most lithography processes using a mask, a pellicle is used to protect the pattern surface of the mask from contamination, e.g., by dust particles. For exposure wavelengths down to 193 nm, the pellicle is conventionally a thin polymer film stretched over a frame fixed to the mask. The thin polymer pellicle has a negligible effect on imaging. However, it is at present not possible to make a thin polymer film that is sufficiently robust and transparent for use with exposure wavelengths of less than 193 nm, e.g., 157 nm. It is therefore proposed to use relatively thick pellicles at these wavelengths, e.g., quartz plates of thickness of several hundred Am, e.g., 300 or 800 .mu.m. Such a thick pellicle will adopt a non-planar shape when in use in a lithographic apparatus and having a different refractive index than the surrounding atmosphere has an optical power. Methods of minimizing the imaging effects of a thick pellicle and/or optimizing its shape are described in co-pending Application No. EP 04252493.4, which document is hereby incorporated by reference in its entirety. However, the present inventors have determined that there remain residual imaging effects due to the thick pellicle that are uncorrected by the methods described.

SUMMARY OF THE INVENTION

Certain embodiments of the present invention can ameliorate and/or compensate for imaging effects caused by the use of a pellicle, especially but not exclusively a thick pellicle.

According to an aspect of the invention, there is provided a lithographic apparatus including an illumination system for providing a projection beam of radiation, a support structure for supporting a mask, the mask serving to impart the projection beam with a pattern in its cross-section and having a pellicle attached thereto by a frame, a substrate table for holding a substrate, and a projection system for projecting the patterned beam onto a target portion of the substrate, wherein the mechanical properties of said frame and/or pellicle are optimized so that the mechanical effect of the frame and pellicle on the mask shape is optimum for imaging.

The present inventors have determined that the effects on the projected image due to the thick pellicle are not solely due to the optical power of the non-planar pellicle. In addition, the presence of the pellicle affects the shape of the mask. Conventionally, the mounting of the mask in the mask table is arranged so that the shape of the mask is one-dimensional, i.e., curved only in the non-scanning direction. It is inevitable that the mask will sag under its own weight when mounted in the mask table. The one-dimensional shape of the mask can be corrected for in imaging and the necessary data to effect this is part of the apparatus set-up. However, the calibrations are carried out using a reference mask that does not have a pellicle and the shape of a mask actually used for device manufacture is affected by the presence of a pellicle. The inventors have therefore determined that tuning, or optimizing, the mechanical properties of the frame, in particular its mass and stiffness, can reduce the effect on the mask shape and/or ensure that the mask adopts an optimum shape. Calibration using a mask with a pellicle attached is not practicable as pellicle to pellicle variation is too great—the calibration results would not be valid for a different pellicle.

In one embodiment of the invention, the mass of the pellicle and frame, which will tend to increase mask sag, and the stiffness of the pellicle and frame, which will tend to reduce mask sag, are balanced so that the mask with pellicle attached adopts substantially the same shape in use as the mask would without pellicle attached. In other words, the pellicle and frame are mechanically neutral.

Image distortion due to the mask shape can also be corrected optically and/or by mask table movements but at the cost of image fading. The present invention may be used in combination with other corrections and may aim at a compromise between image distortion and image fading.

In an embodiment of the invention, the mask is mounted in the mask table along two parallel first mask edges, in a scanner the edges perpendicular to the scanning direction, and the pellicle frame is fixed to the mask and pellicle along first side members that are parallel to said first mask edges. The first side members of said frame are joined by second side members to form a rectangular frame and said mask and said pellicle are compliantly sealed to said second side members. A compliant glue may be used to seal the pellicle and mask to the second side members. The position of the second side members and the stiffness of the compliant mounting between frame, pellicle and mask may be selected to provide the desired mechanical properties of the mask-frame-pellicle combination.

Another aspect of the invention provides a mask having a pellicle attached thereto by a pellicle frame, wherein the pellicle frame comprises first sides that are substantially mutually parallel and second sides that are substantially perpendicular to said first sides, said pellicle being relatively rigidly connected to said first sides and relatively compliantly connected to said second sides.

In an embodiment of this aspect of the invention, the second sides are themselves less rigid that the first sides. The second sides may be sealed to the mask and pellicle by a compliant glue.

According to a further aspect of the invention, there is provided a device manufacturing method including providing a substrate, providing a projection beam of radiation using an illumination system, using a mask to impart the projection beam with a pattern in its cross-section, the mask having a pellicle attached thereto by a frame, and projecting the patterned beam of radiation onto a target portion of the substrate, wherein the mechanical properties of said frame and/or pellicle are optimized so that the mechanical effect of the frame and pellicle on the mask shape is optimum for imaging.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm).

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EMBODIMENTS OF THE INVENTION

Figure 1:
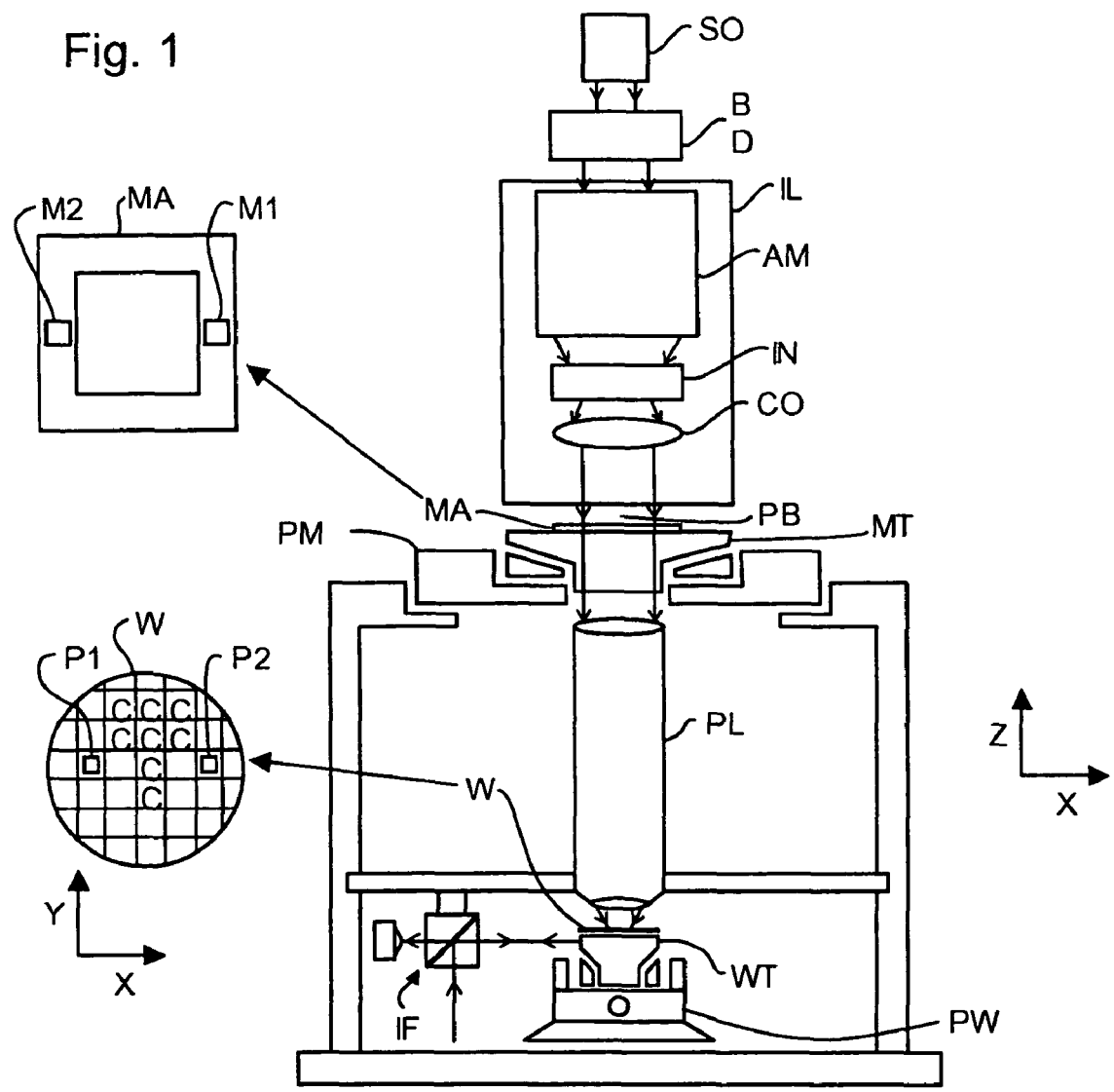
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g., UV radiation or DUV radiation).

a mask table MT for supporting a mask MA and connected to a first positioning device PM for accurately positioning the mask with respect to item PL;

a substrate table (e.g., a wafer table) WT for holding a substrate (e.g., a resist-coated wafer) W and connected to a second positioning device PW for accurately positioning the substrate with respect to item PL; and a projection system (e.g., a refractive projection lens) PL for imaging a pattern imparted to the projection beam PB by mask MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as R-outer and D-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam PB. Similarly, the first positioning device PM and another position sensor (which is not explicitly depicted in FIG. 1) can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
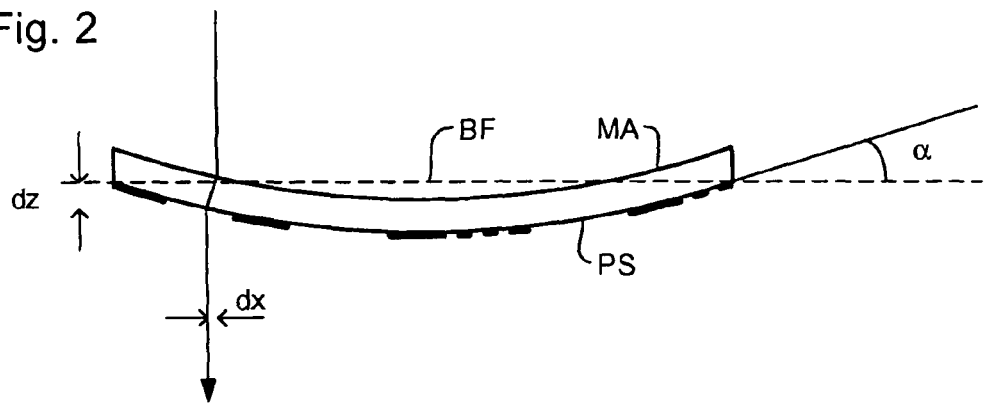
FIG. 2 depicts the effects of mask sag on imaging.

As shown in FIG. 2, the mask MA is normally held in the mask table MT with the patterned surface PS downward and sags, so that the pattern surface is on the convex side of the mask and no longer lies in the best object plane BO. This results in image distortion, since the displacement dx of the image varies as a function of position in the mask, and defocus dz, again varying with position in the mask. The sag is controlled to be essentially one-dimensional by mounting the mask rigidly along two opposite edges (in a scanner normally the edges parallel to the scanning direction) and loosely or not at all along the other two edges. This enables the mask curvature induced effects to be corrected for, e.g., by optical corrections in the projection systems and/or mask table movements, and calibrations are conducted using a reference mask to determine the appropriate corrections to be applied. The reference mask used has no pellicle or pellicle frame attached to it, though is otherwise of standard material and dimensions. If a pellicle is used with production masks, the pellicle frame and pellicle, especially a thick pellicle such as to be used at exposure wavelengths of 157 nm, will affect the mechanical properties of the mask-pellicle combination. The mask will then adopt a different shape in the mask table and the corrections derived from calibrations using the reference mask will no longer apply.

Figure 3:
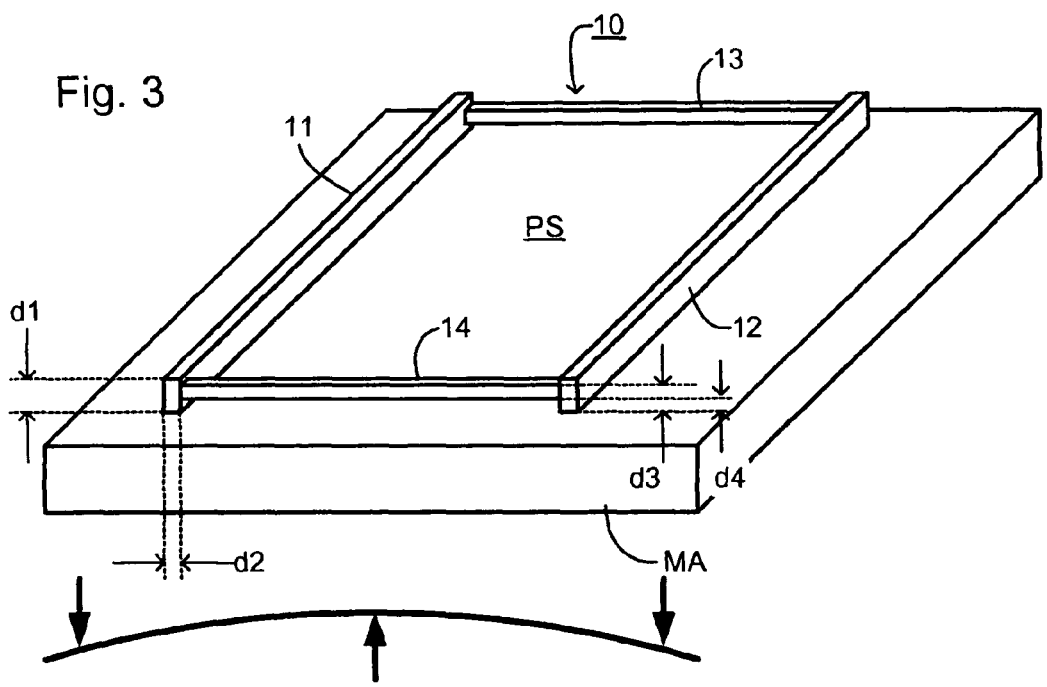
FIG. 3 depicts a mask having a pellicle frame, but no pellicle, attached thereto.
Figure 4:
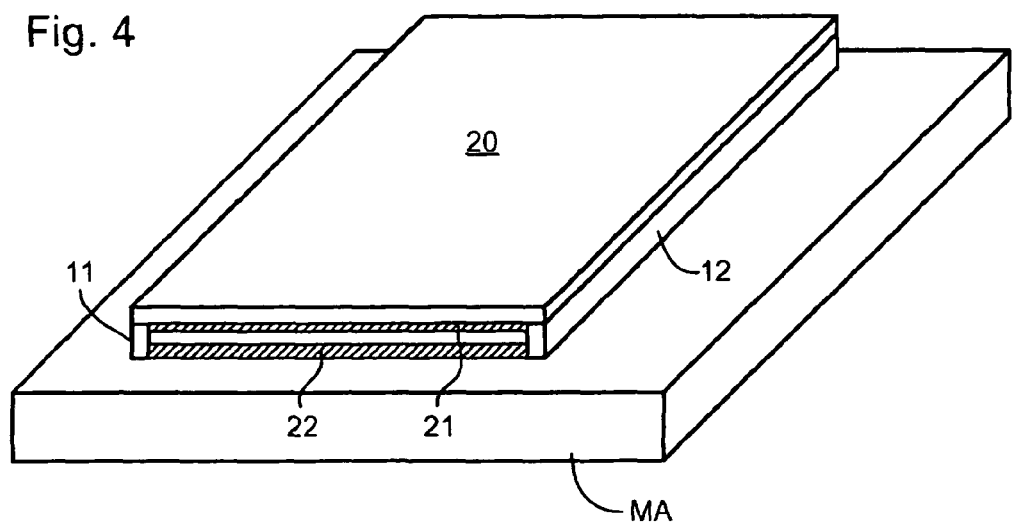
FIG. 4 depicts the mask of FIG. 3 with a pellicle attached.

FIGS. 3 and 4 show a mask MA to which is attached a pellicle frame 10 and pellicle 20 (FIG. 4) according to an embodiment of the invention. Note that in FIGS. 3 and 4 the mask MA is shown inverted as compared to its normal orientation in use for clarity. The pellicle frame 10 is basically rectangular and comprises y-members 11, 12, which extend generally parallel to the y-axis, and x-members 13, 14 which extend generally parallel to the x-axis. The pellicle frame is mounted on the pattern surface PS of the mask MA surrounding the pattern area. Y-members 11 of larger cross-sectional area, and therefore stiffer, compared to the x-members 13, 14. The y-members may have a height d1 of the order of 5 mm and a thickness d2 of the order of 2 mm, for example, and may be glued with a rigid glue to the mask MA.

Pellicle 20 is fixed rigidly, again by glue, to the y-members 11, 12. The gaps between x-members 13, 14 and the pellicle and the mask are sealed, for example by compliant glue 21, 22 as shown in FIG. 4. Other sealing methods may be used as long as the stiffness of the pellicle frame in x-direction remains low.

With such a structure, the mask shape remains one-dimensional even after addition of the pellicle frame and pellicle. The effects of mask sag on imaging therefore remain correctible. Also, the stiffness of the mask-pellicle combination in the x-direction can be tuned by suitable choice of the height d3 of the x-members and their spacing d4 form the mask surface as well as the properties of the glues 21, 22 used to seal the x-members to the mask and pellicle. As explained below, control of the stiffness enables control of the shape of the mask when in place in the mask table. The mask shape may be selected to be the same as the reference mask, in other words the mask-pellicle combination adopts the same shape as the mask would alone, or to have a desired effect on imaging.

The one-dimensional deflection of the mask MA may be approximated as the deflection of a beam supported at each end F1, F2 and supporting its own weight G.

Deflection y(x) is therefore given by the formula:

$$y(x) = \frac{-w \cdot L\left(\frac{1}{16}L^3 - 0.5Lx^2 + x^4/L\right)}{24E \cdot I} + \alpha\left(\frac{x^2 - \frac{1}{4}L^2}{L}\right)$$

where:
w is the force per unit length applied to the beam,
L is the length of the beam,
I is the moment of inertia of the beam,
E is the modulus of elasticity of the beam, and
$\alpha$ is the beam mounting angle (see FIG. 2).

Since w.L is determined by the mass of the mask-pellicle assembly and I by the stiffness of the mask-pellicle assembly, increasing mass therefore tends to increase sag while increasing stiffness reduces sag. Balancing these effects enables the addition of the pellicle and frame to be neutral, as far as sag is concerned. Any residual effects on the mask shape that cannot be eliminated can be corrected for by optical corrections and/or mask table movements.

It should be appreciated that the x- and y-members of the pellicle frame may be hollow or solid and made of any suitable material, for example aluminum. While it is necessary to seal the pellicle to the mask to prevent any contaminants adhering to the pattern surface, it is also desirable to provide a gas communication between inside and outside to enable the internal pressure to equalize to the exterior. With hollow members making up the pellicle frame a pressure equalization path can be provided that extends around the frame, thus minimizing the chance of a particle getting into the interior protected space.

While specific embodiments of the invention have been described above, it will be appreciated that the invention may be practiced otherwise than as described. The description is not intended to limit the invention.

We claim:

1. A lithographic apparatus comprising:
a support structure to support a mask, the mask serving to impart a beam of radiation with a pattern in its cross-section and having a pellicle attached thereto by a frame;
a substrate table to hold a substrate; and
a projection system to project the patterned beam onto a target portion of the substrate, wherein the frame varies in stiffness along a periphery thereof and the pellicle is arranged on the frame such that a sag of the mask is substantially one-dimensional when the mask is mounted to the support structure, and
wherein the frame includes two substantially parallel elongated members defining part of the outer periphery of the frame, the elongated members being connected to a transverse member, and wherein the pellicle is rigidly attached to and in contact with the two elongated members without contacting the transverse member such that the transverse member is spaced apart from the pellicle.

2. The apparatus according to claim 1, wherein the frame and the pellicle are constructed and arranged such that the combined mass of the pellicle and frame and the combined stiffness of the pellicle and frame are balanced so that the mask with pellicle attached adopts substantially a same shape in use as the mask would have without the pellicle attached.

3. The apparatus according to claim 1, wherein the mechanical properties of said frame and/or pellicle are selected so that image distortion induced by the sag is correctable optically and/or by support structure movements.

4. The apparatus according to claim 1, wherein said elongated members of said frame are coupled to two transverse members to form a rectangular frame and said mask and said pellicle are compliantly sealed to said transverse members.

5. The apparatus according to claim 4, wherein said mask and said pellicle are compliantly sealed to said transverse members by a compliant glue.

6. The apparatus according to claim 4, wherein the position of the transverse members and the stiffness of the compliant mounting between frame, pellicle and mask are selected so that image distortion induced by the sag is correctable optically and/or by support structure movements.

7. The apparatus according to claim 1, wherein the pellicle and frame comprise a pellicle-frame assembly and a stiffness and a mass of the pellicle and a stiffness and mass of the frame are selected such that when attached to the mask, the mask sags in substantially one dimension.

8. The apparatus according to claim 1, wherein the dimension of sag is in a direction parallel to a scan direction of motion of the mask during operation.

9. A device manufacturing method comprising:
providing a projection beam of radiation;
using a mask to impart the projection beam with a pattern in its cross-section, the mask having a pellicle attached thereto by a frame; and
projecting the patterned beam of radiation onto a target portion of a substrate, wherein the frame varies in stiffness along a periphery thereof and the pellicle is arranged on the frame such that a sag of the mask is substantially one-dimensional when the mask is mounted to a support structure configured to support the mask, and
wherein the frame includes two substantially parallel elongated members defining part of the outer periphery of the frame, the elongated members being connected to a transverse member, and wherein the pellicle is rigidly attached to and in contact with the two elongated members without contacting the transverse member such that the transverse member is spaced apart from the pellicle.

10. The lithographic apparatus according to claim 1, wherein the pellicle is compliantly coupled to the transverse member.

11. The lithographic apparatus according to claim 1, wherein the transverse member is spaced apart from the support structure.

12. The lithographic apparatus according to claim 10, wherein a compliant material is arranged between the transverse member and the pellicle.

13. The lithographic apparatus according to claim 10, wherein a compliant material is arranged between the transverse member and the support structure.

14. The lithographic apparatus according to claim 10, further comprising another transverse member that is coupled to the two elongated members.

15. The lithographic apparatus according to claim 1, wherein the pellicle is mounted on the upper surface of the two elongated members.

16. The device manufacturing method according to claim 9, wherein the pellicle is mounted on the upper surface of the two elongated members.

* * * * *